(12) United States Patent
Kaji et al.

(10) Patent No.: US 6,758,927 B2
(45) Date of Patent: Jul. 6, 2004

(54) METHOD FOR MAKING MONOLITHIC PIEZOELECTRIC CERAMIC ELEMENT

(75) Inventors: Toshiaki Kaji, Yokaichi (JP); Toshio Imanishi, Toyama (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 0 days.

(21) Appl. No.: 10/346,603

(22) Filed: Jan. 16, 2003

(65) Prior Publication Data

US 2003/0163908 A1 Sep. 4, 2003

(30) Foreign Application Priority Data

Jan. 16, 2002 (JP) .................................. 2002-007674

(51) Int. Cl.[7] .................. H01L 41/22; B32B 31/26; H04R 17/00
(52) U.S. Cl. ................. 156/89.17; 156/89.12; 156/89.14; 29/25.35; 264/618; 264/674
(58) Field of Search .................. 156/89.12, 89.14, 156/89.17; 264/674, 614, 618; 310/358, 364; 29/25.35

(56) References Cited

U.S. PATENT DOCUMENTS 6,045,893 A * 4/2000 Fukushima et al. .......... 428/209
6,221,271 B1 * 4/2001 Watanabe et al. ....... 252/62.9 PZ
2002/0079622 A1 * 6/2002 Randall et al. ............. 264/618
2003/0196740 A1 * 10/2003 Kaji et al. ................ 156/89.14

FOREIGN PATENT DOCUMENTS

| JP | 63-56971 | * | 3/1988 |
| JP | 2-74566 | | 3/1990 |
| JP | 4-357164 | | 12/1992 |
| JP | 10-95665 | | 4/1998 |
| JP | 11-163433 | * | 6/1999 |

* cited by examiner

Primary Examiner—Melvin C. Mayes
(74) Attorney, Agent, or Firm—Dickstein, Shapiro, Morin & Oshinsky, LLP (57) ABSTRACT

A method for making a monolithic piezoelectric ceramic element having high mechanical strength, excellent piezoelectricity, and high reliability is disclosed. The method includes the steps of applying a conductive paste including a conductor containing Ag as a principal ingredient to ceramic green sheets comprising a piezoelectric ceramic material containing a Pb compound, stacking the ceramic green sheets to form a laminate, and firing the laminate in an atmosphere with an oxygen concentration of about 90% by volume or more during the heating period and with an oxygen concentration of about 5% to 15% by volume during the isothermal period and during the cooling period.

16 Claims, 7 Drawing Sheets

METHOD FOR MAKING MONOLITHIC PIEZOELECTRIC CERAMIC ELEMENT

BACKGROUND OF THE INVENTION

1. Field of the Invention

The present invention relates to a method for making piezoelectric ceramic elements used for piezoelectric resonators, piezoelectric actuators, piezoelectric filters, piezoelectric buzzers, piezoelectric transformers, etc., and more particularly, to a method for making a monolithic piezoelectric ceramic element in which a conductor containing Ag as a principal ingredient is used as an internal electrode.

2. Description of the Related Art

With respect to piezoelectric ceramic elements used for piezoelectric resonators, piezoelectric actuators, piezoelectric filters, piezoelectric buzzers, piezoelectric transformers, etc., it is known that firing under the optimum conditions according to the desired use is absolutely necessary to provide elements having excellent characteristics with high reliability, without structural defects. Various attempts have been made for that purpose.

For example, Japanese Unexamined Patent Application Publication No. 2-74566 discloses a process for firing the material while maintaining the oxygen concentration of the furnace atmosphere at 50% by volume or more during the heating period to raise the temperature to the firing temperature, and maintaining the oxygen concentration of the furnace atmosphere between half of the oxygen concentration during the heating process and 10% by volume during the firing temperature retention period. During the heating period in the atmosphere with a high oxygen concentration of 50% by volume or more, the oxygen concentration in the closed pores formed during this period is increased, and during the firing temperature retention period, when the oxygen concentration is controlled between half of the oxygen concentration during the heating period and 10% by volume, the difference in oxygen concentration between the inside of the closed pores and ambient air is increased. Therefore, the oxygen diffusion velocity is increased, and piezoelectric ceramics comprising oxides can be sintered densely in large quantities.

Japanese Unexamined Patent Application Publication Nos. 4-357164 and 10-95665 disclose processes in which firing is performed in an atmosphere with an oxygen concentration of 80% by volume or more throughout the firing profile. Consequently, it is possible to obtain piezoelectric elements, and piezoelectric resonators in particular, in which pores in ceramic grains and structural defects are inhibited, thus being dense and highly reliable.

A process is also known in which firing is performed in air, i.e., in an atmosphere with an oxygen concentration of approximately 21% by volume throughout the firing profile regardless of the types of internal electrodes. This process is employed for various piezoelectric elements.

When a green laminate formed by stacking ceramic green sheets to which an internal electrode conductive paste containing Ag as a principal ingredient is applied is fired in the conventional firing process for piezoelectric ceramic elements, such as the ones as described above, however, the Ag contained in the internal electrodes is incorporated into the ceramic grains in the piezoelectric ceramic layers, resulting in degradation in piezoelectricity.

Lower profile piezoelectric elements have been developed in order to meet higher frequencies in the technical field of piezoelectric elements. When the profile is lowered, although the thickness of the piezoelectric element is decreased, satisfactory mechanical strength is also required in order to prevent the piezoelectric element from being damaged by high-frequency mechanical vibration.

SUMMARY OF THE INVENTION

It is an object of the present invention to provide a method for making a monolithic piezoelectric ceramic element having high mechanical strength, excellent piezoelectricity and high reliability.

In accordance with the present invention, a method for making a monolithic piezoelectric ceramic element includes the steps of applying a conductive paste including a conductor containing Ag as a principal ingredient to ceramic green sheets comprising a piezoelectric ceramic material containing a Pb compound, stacking the ceramic green sheets to form a laminate, and firing the laminate in an atmosphere with an oxygen concentration of about 90% by volume or more during the heating period and with an oxygen concentration of about 5% to 15% by volume during the isothermal period (firing temperature retention period) and during the cooling period.

The oxygen concentration is set at about 90% by volume or more during the heating period in the firing process because if the oxygen concentration is about 90% by volume or more, it is possible to increase the oxygen concentration in pores formed in the ceramic constituting the piezoelectric ceramic element, and oxygen is thereby diffused to suppress the pores in the ceramic grains and the structural defects. As a result, a densely sintered compact can be obtained.

However, if the oxygen concentration is lower than about 90% by volume in the pores formed in the ceramic constituting the piezoelectric ceramic element, it is not possible to decrease the pores satisfactorily since the oxygen concentration is insufficient. As a result, a densely sintered compact cannot be obtained, and the transverse strength of the ceramic is decreased.

The oxygen concentration is set in the range of about 5% to 15% by volume during the isothermal period and during the cooling period because if the oxygen concentration is about 5% to 15% by volume, it is possible to decrease the Pb content in the grain boundaries of the ceramic constituting the piezoelectric ceramic element, and characteristics of the piezoelectric ceramic element, i.e., piezoelectricity and reliability, can be improved.

In an atmosphere with a high oxygen concentration of 90% by volume or more during the heating period, the Pb vapor pressure is increased and evaporation of Pb from the piezoelectric ceramic element itself is decreased, and redeposition of Pb from the atmosphere also occurs, resulting in an increase in the Pb content in the ceramic grain boundaries. In the subsequent atmosphere with a low oxygen concentration of about 5% to 15% by volume during the isothermal period and during the cooling period, since evaporation of Pb which is present in the grain boundaries of the ceramic constituting the piezoelectric element is accelerated, the Pb vapor pressure is decreased and the impurity content in the grain boundaries is decreased. Therefore, the characteristics of the piezoelectric element itself are improved.

If the oxygen concentration exceeds about 15% by volume, the effect of decreasing the Pb content in the ceramic grain boundaries is lost, resulting in degradation in piezoelectricity.

If the oxygen concentration is lower than about 5% by volume, the piezoelectric element itself is reduced, resulting in degradation in piezoelectricity.

In the case of lead zirconate titanate (PZT)-based compound, firing is performed during the heating period in an atmosphere with an oxygen concentration of approximately 90% by volume or more. The firing temperature in the isothermal period, i.e., in the maximum temperature range, is set at the temperature when sintering of the laminate is complete in the atmosphere, i.e., specifically, is set at the temperature when the pack density of the monolithic sintered compact is 99% or more of the theoretical density. Additionally, the retention time in the maximum temperature range is also set under the same condition as that for the firing temperature.

Each of the heating rate and the cooling rate is set in the range of about 1° C. to 10° C. per minute, and the retention time in the maximum temperature range is set in the range of about 1 to 10 hours.

However, the firing conditions are not limited to those described above. Optimum firing temperature, heating rate, retention time and cooling rate may be selected depending on the type (composition) of the piezoelectric ceramic material containing the Pb compound.

As the piezoelectric ceramic material for the ceramic green sheets, in addition to the lead zirconate titanate (PZT)-based compound, a lead titanate ($PbTiO_3$)-based compound, a lead metaniobate ($PbNb_2O_6$)-based compound, a lead metatantalate ($PbTa_2O_6$)-based compound, or the like may be used.

The conductor included in the conductive paste for internal electrodes contains Ag as a principal ingredient and can contain Pd content of about 50% by weight or less.

DESCRIPTION OF THE PREFERRED EMBODIMENTS

A method for making a monolithic ceramic element in the present invention will be described in detail based on a monolithic piezoelectric transformer (Example 1) and a monolithic piezoelectric actuator (Example 2).

EXAMPLE 1

As starting materials, $Pb_3O_4$, $TiO_2$, $ZrO_2$, $SnO_2$, $Sb_2O_3$ and $MnCO_3$ were prepared.

The starting materials were weighed so as to obtain a piezoelectric ceramic containing 99.94% by weight of a principal ingredient represented by the formula $Pb((Sn_{1/3}Sb_{2/3})_{0.10}Zr_{0.45}Ti_{0.45})O_3$ and 0.06% by weight of MnO as an additive, and wet-mixing was performed using a ball mill. The mixture was dehydrated, dried and calcined at 820° C. for 2 hours, followed by pulverization to obtain a calcined powder.

An acrylic organic binder, an organic solvent, and additives such as a plasticizer, were added to the calcined powder, and wet-mixing was performed using a ball mill to obtain a slurry. The slurry was formed into a ceramic green sheet with a thickness of approximately 100 μm using the doctor blade process.

A conductive paste containing an Ag/Pd conductor was applied onto the ceramic green sheet by screen printing so that the thickness after firing was 1.0 to 3.0 μm, followed by drying. Ceramic green sheets provided with internal electrode layers were thereby obtained. The ceramic green sheets were stacked and press-bonded by hot pressing to obtain a monolithic green compact.

The green compact was cut into test pieces (samples) with a predetermined size. The binder component was removed from the samples by primarily heating at approximately 500° C., and firing was performed using the firing profiles and firing atmospheres shown in Table 1 below.

The heating rate was 4° C./minute, the retention time in the maximum temperature range was 3 hours, and the cooling rate was 4° C./minute.

In Table 1, the asterisked firing atmospheres are out of the range of the present invention, and the others are within the range of the present invention.

TABLE 1

| | Oxygen Concentration (unit: % by volume) | | |
|---|---|---|---|
| Firing atmosphere No. | Heating Period 600° C. to 1,100° C. | Isothermal Period 1,100° C. | Cooling Period 1,100° C. to 600° C. |
| J1* | 85 | 10 | 10 |
| J2 | 90 | 10 | 10 |
| J3 | 95 | 10 | 10 |
| J4* | 95 | 2 | 10 |
| J5 | 95 | 5 | 10 |
| J6 | 95 | 15 | 10 |
| J7* | 95 | 21 | 10 |
| J8* | 95 | 10 | 2 |
| J9 | 95 | 10 | 5 |
| J10 | 95 | 10 | 15 |
| J11* | 95 | 10 | 21 |
| J12* | 21 | 21 | 21 |
| J13* | 90 | 90 | 90 |

An external electrode material was applied to the monolithic sintered compacts, followed by firing to form input external electrodes and output external electrodes. Monolithic piezoelectric transformers were thereby obtained.

Figure 1:
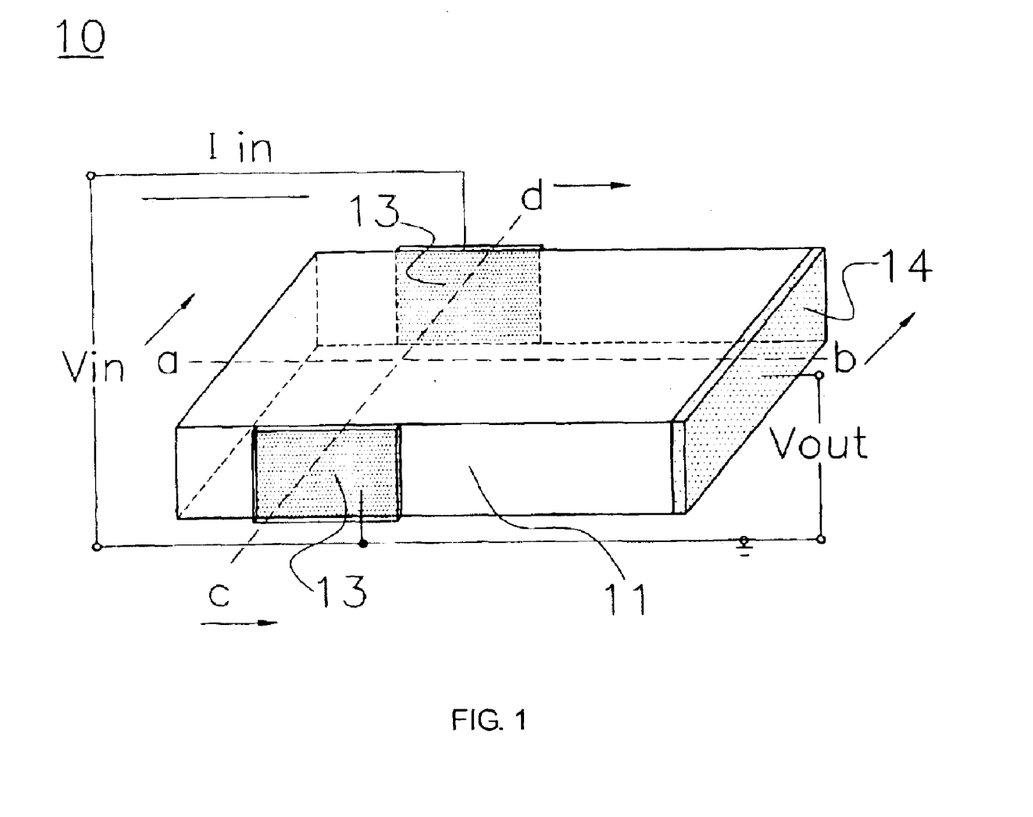
FIG. 1 is a perspective view of a monolithic piezoelectric transformer in Example 1 of the present invention.
Figure 2:
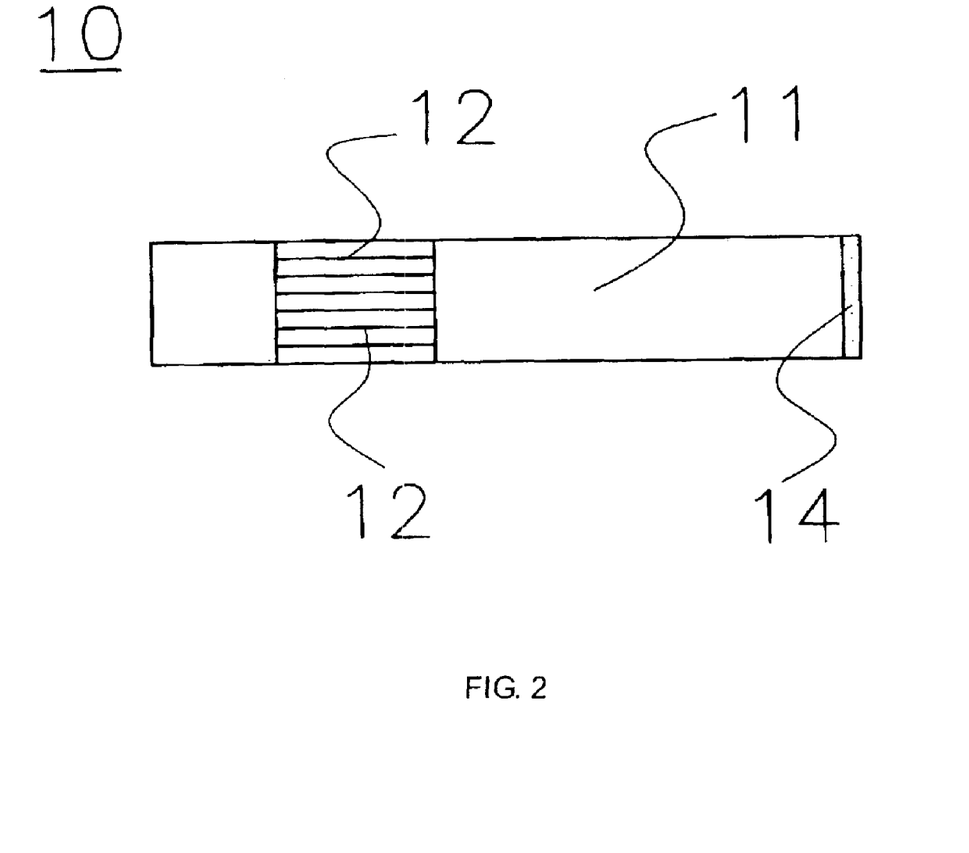
FIG. 2 is a sectional view of the monolithic piezoelectric transformer taken along the line a-b of FIG. 1.
Figure 3:
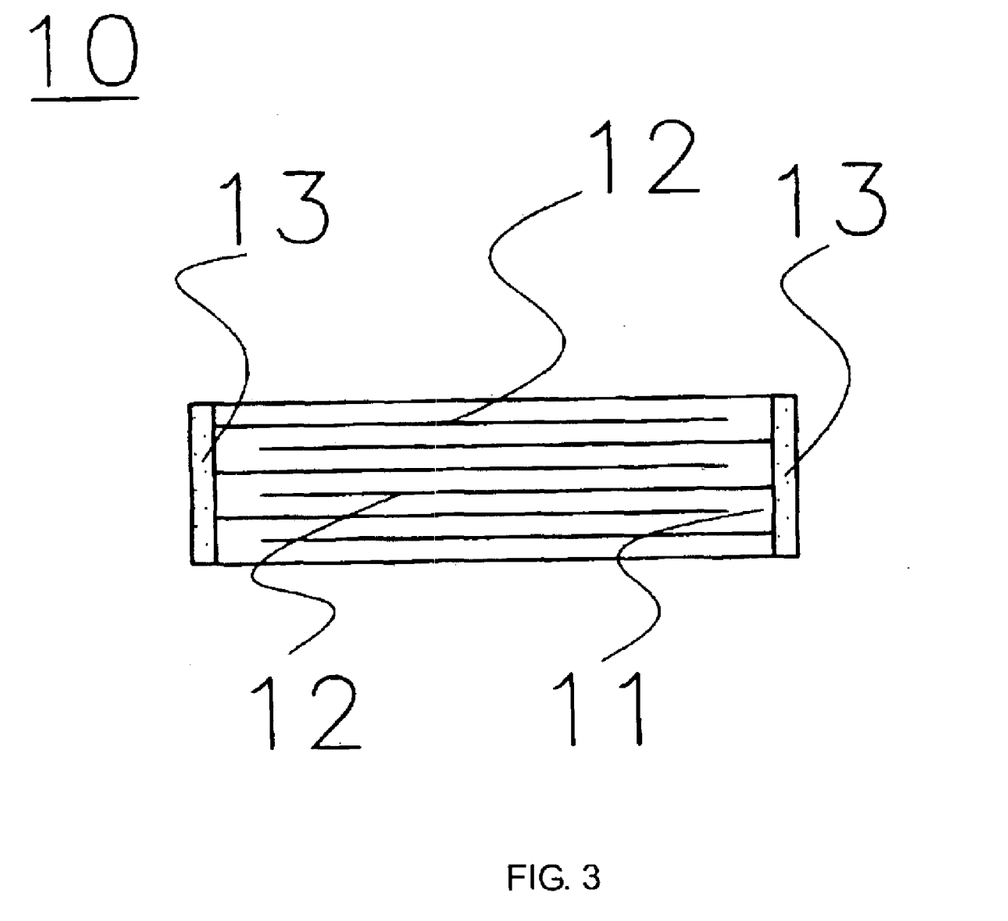
FIG. 3 is a sectional view of the monolithic piezoelectric transformer taken along the line c-d of FIG. 1.

Next, a polarization treatment was performed on each sample in an insulating oil at 60° C. in the thickness direction with respect to the input section and in the longitudinal direction with respect to the output section. In the polarization treatment, a DC electric field of 4.0 kV/mm was applied for 60 minutes. Aging was then performed in air at 120 to 200° C. for 30 to 60 minutes. A monolithic piezoelectric transformer 10 shown in FIGS. 1 to 3 was thereby obtained. In FIGS. 1 to 3, reference numeral 11 represents a piezoelectric ceramic, reference numeral 12 represents an internal electrode, reference numeral 13 represents an input (primary) external electrode, and reference numeral 14 represents an output (secondary) external electrode.

With respect to the monolithic piezoelectric transformers thus obtained, transformer characteristics, i.e., the maximum step-up ratio and maximum efficiency, were obtained by the methods described below. The transverse strength and pore factor of each monolithic piezoelectric transformer itself were also obtained by the methods described below. The results thereof are shown in Table 2.

In Table 2, the asterisked samples are out of the range of the present invention, and all the other samples are within the range of the present invention.

Figure 4:
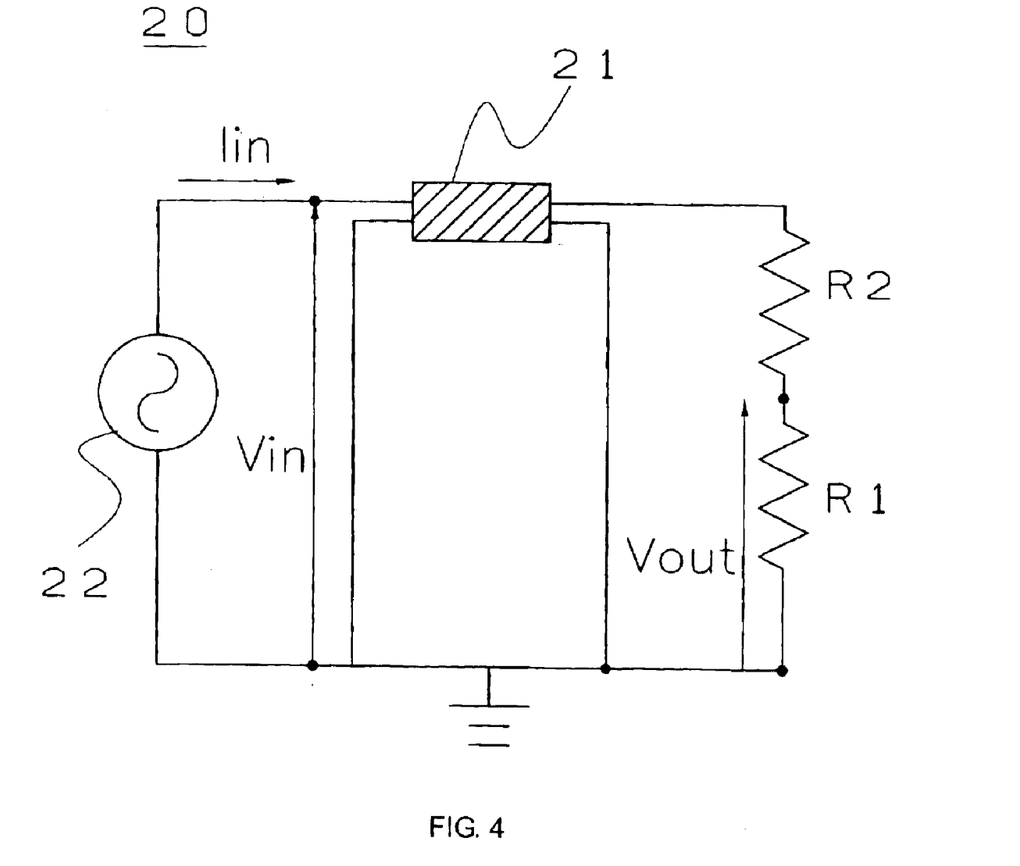
FIG. 4 is a diagram which shows a system for measuring the transformer characteristics of the monolithic piezoelectric transformer in Example 1.

In order to measure the maximum step-up ratio and maximum efficiency, a measurement system 20 shown in FIG. 4 was used. The input voltage $V_{in}$, input current $I_{in}$ and output voltage $V_{out}$ were measured by a power analyzer. A variable-frequency AC power source was used and cos Φ represents the power factor thereof. In FIG. 4, reference numeral 21 represents an AC power supply and reference numeral 22 represents a monolithic piezoelectric transformer. The resistances R1 and R2 were 1 kΩ and 100 kΩ, respectively.

The step-up ratio is a ratio of input voltage $V_{in}$ to output voltage $V_{out}$, and the maximum step-up ratio is calculated by the equation 1 below. The output voltage $V_{out}$ corresponds to the maximum value when a constant voltage $V_{in}$ is applied using an AC power supply. The unit of the maximum step-up ratio is dB.

The efficiency is a ratio of input power to output power, and the maximum efficiency is calculated by the equation 2 below. The output voltage $V_{out}$ corresponds to the maximum value when a constant voltage $V_{in}$ is applied using an AC power supply. The unit of the maximum efficiency is %.

$$\text{Maximum step-up ratio} = 20 \times \log(V_{out} \div V_{in} \times 101) \quad \text{Equation 1}$$

$$\text{Maximum efficiency} = 101 \times V_{out}^2 \times 0.001 \div (V_{in} \times I_{in} \cos\Phi) \quad \text{Equation 2}$$

The step-up ratio shows a key performance of the transformer, and as the step-up ratio is increased, the performance is increased. The efficiency shows the conversion efficiency of energy from electric through mechanical to electric energy, and as the efficiency is increased, power consumption is decreased because of a lower conversion loss to input power.

The transverse strength was measured based on the testing method for ceramic bending strength according to Japanese Industrial Standards (JIS) R1601. In order to calculate the pore factor, the monolithic piezoelectric transformer was mirror-polished and a real ratio of the dense section to the pore section of the ceramic was determined by image processing.

As the transverse strength is increased, the mechanical strength of the piezoelectric ceramic itself is increased, and as the pore factor is decreased, the density of the piezoelectric ceramic itself is increased.

TABLE 2

| | | Characteristics | | | |
|---|---|---|---|---|---|
| Sample No. | Firing Atmosphere No. | Maximum Step-up Ratio (dB) | Maximum Efficiency (%) | Pore Factor (%) | Transverse Strength (MPa) |
| 1* | J1* | 31.5 | 94.5 | 1.7 | 115 |
| 2 | J2 | 31.5 | 95.4 | 0.7 | 125 |
| 3 | J3 | 31.1 | 95.6 | 0.5 | 130 |
| 4* | J4* | 28.3 | 88 | 0.6 | 128 |
| 5 | J5 | 31.8 | 95.6 | 0.7 | 129 |
| 6 | J6 | 32.0 | 95.1 | 0.6 | 125 |
| 7* | J7* | 29.4 | 89.5 | 0.5 | 132 |
| 8* | J8* | 29.5 | 89.7 | 0.8 | 123 |
| 9 | J9 | 31.3 | 95.2 | 0.6 | 129 |
| 10 | J10 | 31.4 | 95.4 | 0.6 | 130 |
| 11* | J11* | 29.8 | 89.8 | 0.6 | 128 |
| 12* | J12* | 30.8 | 94.5 | 3.2 | 96.8 |
| 13* | J13* | 28.0 | 88.7 | 0.7 | 126 |

Tables 1 and 2 show that with respect to the piezoelectric elements fired under the firing atmosphere conditions in the range of the present invention, as seen in Sample Nos. 2, 3, 5, 6, 9, and 10, densely sintered compacts with a pore factor of 1% or less are obtained, the transverse strength is high at 120 MPa or more, and the transformer characteristics are also satisfactory with a maximum step-up ratio of 31 dB or more and a maximum efficiency of 95% or more.

Consequently, it is possible to obtain a monolithic piezoelectric ceramic element having high mechanical strength, excellent piezoelectricity and high reliability.

The reasons for limitations on the firing atmosphere conditions of the present invention will be described with reference to Table 2.

The oxygen concentration is set at about 90% by volume or more during the heating period because if the oxygen concentration is less than about 90% by volume, as in the case of Sample No. 1, a densely sintered compact is not obtained (a pore factor is approximately 2%), and the transverse strength is also low at less than 120 MPa.

The oxygen concentration is set in the range of about 5% to 15% by volume during the isothermal period because if the oxygen concentration is less than about 5% by volume as in the case of Sample No. 4, or if the oxygen concentration exceeds about 15% by volume as in the case of Sample No. 7, the transformer characteristics are degraded with the maximum step-up ratio of less than 30 dB and the maximum efficiency of less than 90%.

The oxygen concentration is set in the range of about 5% to 15% by volume during the cooling period because if the oxygen concentration is less than about 5% by volume as in the case of Sample No. 8, or if the oxygen concentration exceeds about 15% by volume as in the case of Sample No. 11, the transformer characteristics are degraded with the maximum step-up ratio of less than 30 dB and the maximum efficiency of less than 90%.

Additionally, Sample Nos. 12 and 13 are examples in which the oxygen concentration was set at 21% and 90%, respectively, during all of the heating, isothermal and cooling periods. With respect to Sample No. 12, a densely sintered compact is not obtained (pore factor of approximately 3%), and the transverse strength is low at less than 100 MPa. With respect to Sample No. 13, the transformation characteristics are degraded with a maximum step-up ratio of less than 30 dB and a maximum efficiency of less than 90%.

As described above, it is possible to achieve a high mechanical strength and satisfactory transformer characteristics by firing monolithic piezoelectric transformers using the firing atmosphere conditions in the range of the present invention.

EXAMPLE 2

As starting materials, $Pb_3O_4$, $TiO_2$, $ZrO_2$ and $SrCO_3$ were prepared. The starting materials were weighed so as to obtain a piezoelectric ceramic composition represented by the formula $Pb_{0.98}Sr_{0.02}(Zr_{0.45}Ti_{0.55})O_3$, and wet-mixing was performed using a ball mill.

The mixture was dehydrated, dried and calcined at 800° C. for 2 hours, followed by pulverization to obtain a calcined powder.

An acrylic organic binder, an organic solvent, and additives such as a plasticizer, were added to the calcined powder, and wet-mixing was performed using a ball mill to obtain a slurry.

The slurry was formed into a ceramic green sheet with a thickness of approximately 40 μm using the doctor blade process.

A conductive paste containing an Ag/Pd conductor was applied onto the ceramic green sheet by screen printing so that the thickness after firing was 1.0 to 3.0 μm, followed by drying. Ceramic green sheets provided with internal electrode layers were thereby obtained. The ceramic green sheets were stacked and press-bonded by hot pressing to obtain a monolithic green compact.

The binder component was removed from the green compact by preliminary heating at approximately 500° C., and firing was performed using the firing profiles and firing atmospheres shown in Table 1.

The heating rate was 4° C./minute, the retention time in the maximum temperature range was 3 hours and the cooling rate was 4° C./minute.

In Table 1, the asterisked firing atmospheres are out of the range of the present invention, and the others are within the range of the present invention.

Each monolithic sintered compact was cut into a predetermined size. An external electrode material was applied the monolithic sintered compact, followed by firing to form external electrodes. A monolithic piezoelectric actuator in which the external electrodes were electrically connected to the internal electrodes was thereby obtained.

Figure 5:
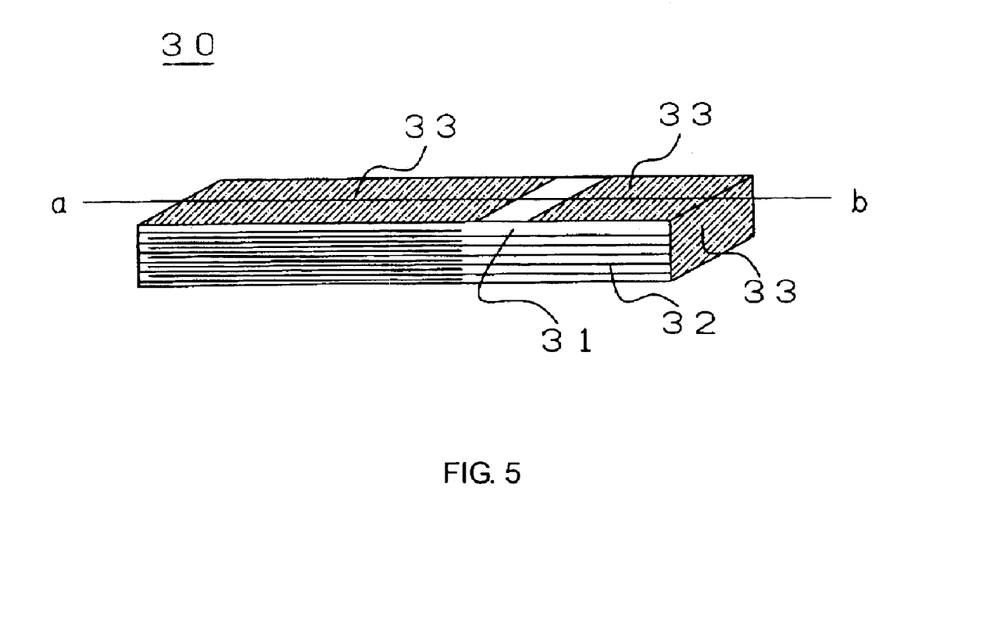
FIG. 5 is a perspective view of a monolithic piezoelectric actuator in Example 2 of the present invention.
Figure 6:
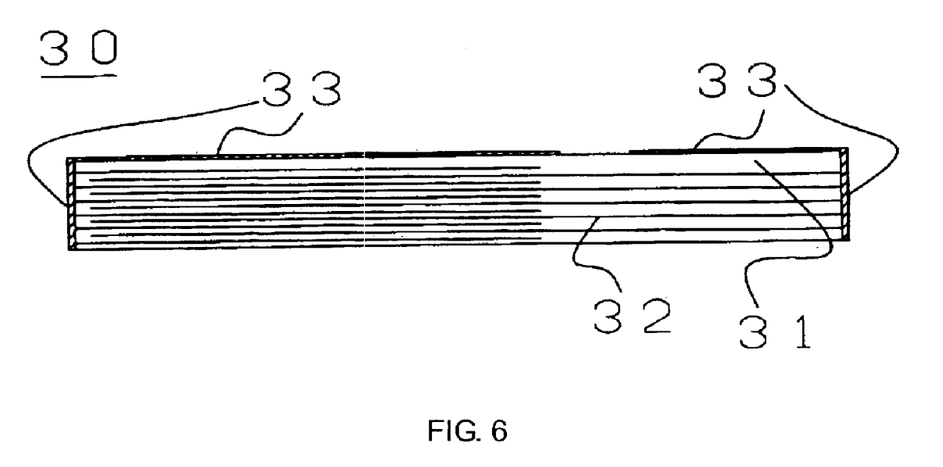
FIG. 6 is a sectional view of the monolithic piezoelectric actuator taken along the line a-b of FIG. 5.

Next, a polarization treatment was performed on each sample in an insulating oil at 60° C. by applying a DC electric field of 4.0 kV/mm for 60 minutes. Aging was then performed in air at 120 to 200° C. for 30 to 60 minutes. A monolithic piezoelectric actuator 30 shown in FIGS. 5 and 6 was thereby obtained. In FIGS. 5 and 6, reference numeral 31 represents a piezoelectric ceramic, reference numeral 32 represents an internal electrode, and reference numeral 33 represents an external electrode.

With respect to the monolithic piezoelectric actuators thus obtained, the piezoelectric strain constant $|d_{31}|$ and the electrical resistance ρ of the piezoelectric ceramic were measured. The results thereof are shown in Table 3.

In order to determine the piezoelectric strain constant $|d_{31}|$, the amount of strain was measured by a laser Doppler vibrometer and the piezoelectric strain constant in the 31 direction was calculated. In order to determine the electrical resistance ρ, the insulation resistance was measured when a DC voltage of 50V was applied between the internal electrodes through the ceramic layer for 30 seconds, and the product obtained by multiplying the insulation resistance by the electrode area was divided by the thickness of the ceramic layer.

In Table 3, the asterisked samples are out of the range of the present invention, and all the other samples are within the range of the present invention.

TABLE 3

| | | Characteristics | | | |
|---|---|---|---|---|---|
| Sample No. | Firing Atmosphere No. | $\|d_{31}\|$ ($10^{-12}$C/N) | ρ ($10^{12}$Ω · cm) | Pore Factor (%) | Transverse Strength (MPa) |
| 14* | J1* | 212 | 6.1 | 1.6 | 105 |
| 15 | J2 | 208 | 6.5 | 0.5 | 118 |
| 16 | J3 | 210 | 6.0 | 0.6 | 115 |
| 17* | J4* | 197 | 1.0 | 0.7 | 118 |
| 18 | J5 | 211 | 6.1 | 0.6 | 120 |
| 19 | J6 | 210 | 5.7 | 0.6 | 119 |
| 20* | J7* | 201 | 0.98 | 0.5 | 119 |
| 21* | J8* | 199 | 2.5 | 0.7 | 120 |
| 22 | J9 | 208 | 6.2 | 0.7 | 121 |
| 23 | J10 | 207 | 5.9 | 0.6 | 118 |
| 24* | J11* | 196 | 1.5 | 0.7 | 119 |
| 25* | J12* | 206 | 5.9 | 2.6 | 94.5 |
| 26* | J13* | 190 | 0.56 | 0.7 | 121 |

Tables 1 and 3 reveal that with respect to the piezoelectric elements fired under the firing atmosphere within the range of the present invention, as seen in Sample Nos. 15, 16, 18, 19, 22, and 23, densely sintered compacts with a pore factor of 1% or less are obtained, the transverse strength is high at 110 MPa or more, and piezoelectricity and reliability are satisfactory with a piezoelectric strain constant $|d_{31}|$ of $2 \times 10^{-10}$ C/N and an electrical resistance ρ of $5 \times 10^{12}$ Ω·m. Consequently, it is possible to obtain a monolithic piezoelectric ceramic element having high mechanical strength, excellent piezoelectricity and high reliability.

The reasons for limitations on the firing atmosphere conditions of the present invention will be described with reference to Table 3.

The oxygen concentration is set at about 90% by volume or more during the heating period because if the oxygen concentration is less than about 90% by volume, as in the case of Sample No. 14, a densely sintered compact is not obtained (pore factor of approximately 2%), and the transverse strength is also low at less than 110 MPa.

The oxygen concentration is set in the range of about 5% to 15% by volume during the isothermal period because if the oxygen concentration is less than about 5% by volume as in the case of Sample No. 17, or if the oxygen concentration exceeds about 15% by volume as in the case of Sample No. 20, the piezoelectricity and reliability are degraded with a piezoelectric strain constant $|d_{31}|$ of less than $2 \times 10^{-10}$ C/N or an electrical resistance p of less than $5 \times 10^{12}$ Ω·m.

The oxygen concentration is set in the range of about 5% to 15% by volume during the cooling period because if the oxygen concentration is less than about 5% by volume as in the case of Sample No. 21, or if the oxygen concentration exceeds about 15% by volume as in the case of Sample No. 24, the piezoelectricity and reliability are degraded with a piezoelectric strain constant $|d_{31}|$ of less than $2 \times 10^{-10}$ C/N or an electrical resistance p of less than $5 \times 10^{12}$ Ω·m.

Additionally, Sample Nos. 25 and 26 are examples in which the oxygen concentration was set at 21% and 90%, respectively, during all of the heating, isothermal and cooling periods. With respect to Sample No. 25, a densely sintered compact is not obtained (pore factor of approximately 3%), and the transverse strength is low at less than 100 MPa. With respect to Sample No. 26, the piezoelectricity and reliability are degraded with a piezoelectric strain constant $|d_{31}|$ of less than $2 \times 10^{-10}$ C/N and an electrical resistance p of less than $5 \times 10^{12}$ Ω·m.

As described above, it is possible to achieve high mechanical strength, satisfactory piezoelectricity, and high reliability by firing monolithic piezoelectric actuators using the firing atmosphere conditions in the range of the present invention.

Figure 7:
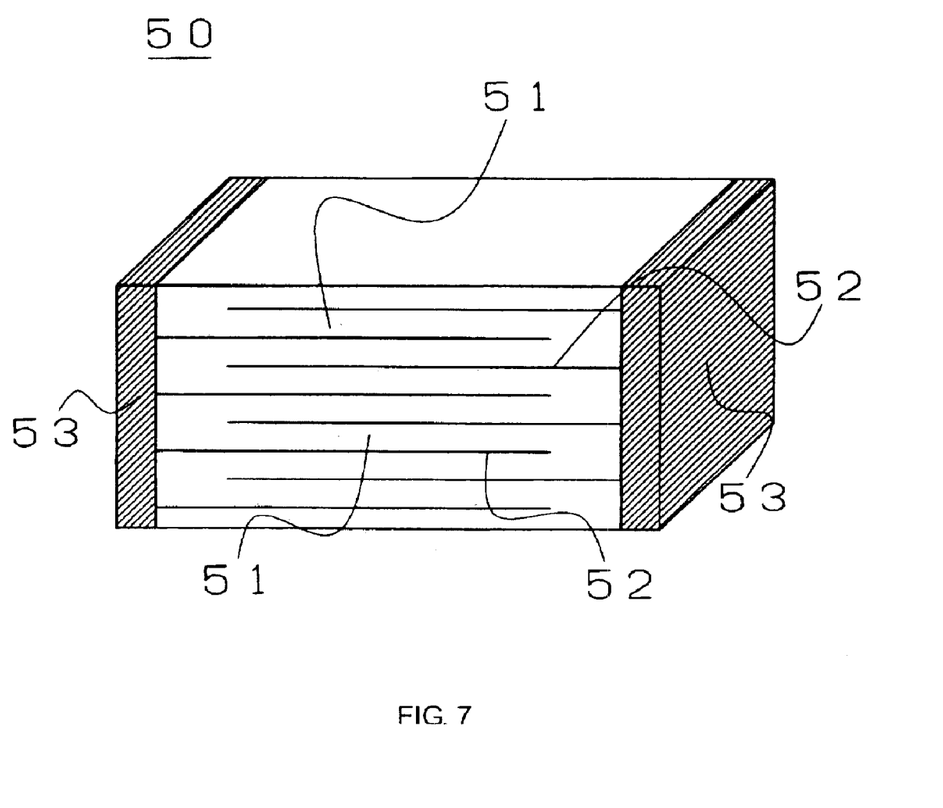
FIG. 7 is a perspective view of a monolithic piezoelectric element for ink-jet use to which the present invention is applicable.

Although monolithic piezoelectric transformers and actuators have been described in the above examples, the present invention is not limited thereto. The present invention is also applicable to monolithic piezoelectric ceramic elements in general, such as piezoelectric resonators, piezoelectric filters and piezoelectric buzzers using the piezoelectric effect. FIG. 7 is a perspective view of a monolithic piezoelectric element 50 for inkjet use to which the present invention is applicable. Reference numeral 51 represents a piezoelectric ceramic, reference numeral 52 represents an internal electrode and reference numeral 53 represents an external electrode.

What is claimed is:

1. A method for making a monolithic piezoelectric ceramic element comprising:

providing a laminate which comprises a stack comprising a plurality of ceramic green sheets comprising a piezoelectric ceramic material containing Pb and a conductive paste comprising a conductor containing Ag as a principal ingredient disposed at an interface between one pair of adjacent sheets; and firing the laminate in a profile comprising a heating period, an isothermal period and a cooling period, wherein the firing is conducted in an atmosphere with an oxygen concentration of about 90% by volume or more during the heating period and with an oxygen concentration of about 5% to 15% by volume during the isothermal period and during the cooling period.

2. A method for making a monolithic piezoelectric ceramic element according to claim 1, further comprising forming said laminate.

3. A method for making a monolithic piezoelectric ceramic element according to claim 2, wherein said laminate is formed by applying a conductive paste comprising a conductor containing Ag as a principal ingredient to a ceramic green sheet comprising a piezoelectric ceramic material containing Pb, and forming a stack by combining said paste carrying sheet with other ceramic green sheets comprising a piezoelectric ceramic material containing Pb.

4. A method for making a monolithic piezoelectric ceramic element according to claim 3, wherein the oxygen concentration during the isothermal period and during the cooling period is the same.

5. A method for making a monolithic piezoelectric ceramic element according to claim 3, wherein the oxygen concentration during the isothermal period and during the cooling period are different.

6. A method for making a monolithic piezoelectric ceramic element according to claim 3, wherein the piezoelectric ceramic material is a PZT ceramic.

7. A method for making a monolithic piezoelectric ceramic element according to claim 6, wherein the paste contains up to about 50% Pb.

8. A method for making a monolithic piezoelectric ceramic element according to claim 2, wherein the oxygen concentration during the isothermal period and during the cooling period is the same.

9. A method for making a monolithic piezoelectric ceramic element according to claim 2, wherein the oxygen concentration during the isothermal period and during the cooling period are different.

10. A method for making a monolithic piezoelectric ceramic element according to claim 2, wherein the piezoelectric ceramic material is a PZT ceramic.

11. A method for making a monolithic piezoelectric ceramic element according to claim 10, wherein the paste contains up to about 50% Pb.

12. A method for making a monolithic piezoelectric ceramic element according to claim 1, wherein the oxygen concentration during the isothermal period and during the cooling period is the same.

13. A method for making a monolithic piezoelectric ceramic element according to claim 1, wherein the oxygen concentration during the isothermal period and during the cooling period are different.

14. A method for making a monolithic piezoelectric ceramic element according to claim 1, wherein the piezoelectric ceramic material is a PZT ceramic.

15. A method for making a monolithic piezoelectric ceramic element according to claim 14, wherein the paste contains up to about 50% Pb.

16. A method for making a monolithic piezoelectric ceramic element according to claim 1, wherein the paste contains up to about 50% Pb.

* * * * *